(12) United States Patent
Li et al.

(10) Patent No.: US 9,847,261 B2
(45) Date of Patent: Dec. 19, 2017

(54) METAL REFLOW FOR MIDDLE OF LINE CONTACTS

(71) Applicant: International Business Machines Corporation, Armonk, NY (US)

(72) Inventors: Juntao Li, Cohoes, NY (US); Junli Wang, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 15 days.

(21) Appl. No.: 15/134,750

(22) Filed: Apr. 21, 2016

(65) Prior Publication Data
US 2017/0162448 A1   Jun. 8, 2017

Related U.S. Application Data (62) Division of application No. 14/956,720, filed on Dec. 2, 2015, now Pat. No. 9,741,577.

(51) Int. Cl.
*H01L 21/8238* (2006.01)
*H01L 21/768* (2006.01)
*H01L 21/285* (2006.01)

(52) U.S. Cl.
CPC .. *H01L 21/823871* (2013.01); *H01L 21/2855* (2013.01); *H01L 21/76805* (2013.01); *H01L 21/76843* (2013.01); *H01L 21/76895* (2013.01)

(58) Field of Classification Search
CPC .................. H01L 21/823871; H01L 23/52
See application file for complete search history.

(56) References Cited

U.S. PATENT DOCUMENTS

| 2002/0064592 A1* | 5/2002 | Datta ...................... C23C 18/30 438/618 |
| 2004/0038517 A1* | 2/2004 | Kang ................ H01L 21/28518 438/630 |
| 2007/0180953 A1* | 8/2007 | Uchikoshi ........... C22B 23/0423 75/371 |
| 2008/0132050 A1* | 6/2008 | Lavoie ................ C23C 14/0084 438/584 |

(Continued)

OTHER PUBLICATIONS

List of IBM Patents or Patent Applications Treated As Related—Date Filed: Jun. 22, 2016; 1 page.

(Continued)

*Primary Examiner* — Eugene Lee
(74) *Attorney, Agent, or Firm* — Cantor Colburn LLP; Jennifer Anda (57) ABSTRACT

A method of forming a contact in a semiconductor device includes forming a first gate and a second gate on a substrate; removing an interlayer dielectric (ILD) material arranged between the first gate and the second gate to form a trench that extends from a surface of the first gate and a surface of the second gate to the substrate; depositing a liner along a sidewall of the trench and an endwall of the trench in contact with the substrate; depositing by a physical vapor deposition method (PVD) a layer of metal on a surface of the first gate and a surface of the second gate; and heating to reflow metal from the layer of metal on the surface of the first gate and the second gate into the trench and form the contact.

14 Claims, 8 Drawing Sheets

(56) References Cited

U.S. PATENT DOCUMENTS

| | | | |
|---|---|---|---|
| 2009/0053426 A1* | 2/2009 | Lu | C23C 16/16 427/540 |
| 2014/0287577 A1* | 9/2014 | Emesh | H01L 21/76879 438/618 |
| 2015/0093891 A1* | 4/2015 | Zope | H01L 21/76877 438/618 |
| 2015/0203961 A1* | 7/2015 | Ha | C23C 16/045 427/124 |

OTHER PUBLICATIONS

Juntao Li, et al.; "Metal Reflow for Middle of Line Contacts"; U.S. Appl. No. 14/956,720, filed Dec. 2, 2015.
List of IBM Patents or Patent Applications Treated As Related—Date Filed: Apr. 21, 2016; 1 page.

* cited by examiner

METAL REFLOW FOR MIDDLE OF LINE CONTACTS

DOMESTIC PRIORITY

This application is a continuation of and claims priority from U.S. patent application Ser. No. 14/956,720, filed on Dec. 2, 2015, entitled "METAL REFLOW FOR MIDDLE OF LINE CONTACTS", the entire contents of which are incorporated herein by reference.

BACKGROUND

The present invention relates to complementary metal oxide semiconductor (CMOS), and more specifically, to methods for forming contacts.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

SUMMARY

According to an embodiment, a method of forming a contact in a semiconductor device includes forming a first gate and a second gate on a substrate; removing an interlayer dielectric (ILD) material arranged between the first gate and the second gate to form a trench that extends from a surface of the first gate and a surface of the second gate to the substrate; depositing a liner along a sidewall of the trench and an endwall of the trench in contact with the substrate; depositing by a physical vapor deposition method (PVD) a layer of metal on a surface of the first gate and a surface of the second gate; and heating to reflow metal from the layer of metal on the surface of the first gate and the second gate into the trench and form the contact.

According to another embodiment, a method of forming a contact in a semiconductor device includes forming a first gate and a second gate on a substrate; removing an interlayer dielectric (ILD) arranged between the first gate and the second gate to form a trench that extends from a surface of the first gate and a surface of the second gate to the substrate; depositing a liner along a sidewall of the trench and an endwall of the trench in contact with the substrate; depositing by a physical vapor deposition method (PVD) a layer of high purity cobalt on a surface of the first gate and a surface of the second gate, the high purity cobalt including less than 200 ppm impurities; and heating to reflow cobalt from the layer of high purity cobalt on the surface of the first gate and the second gate into the trench to form the contact.

Yet, according to another embodiment, a semiconductor device includes a first gate and a second gate arranged on a substrate; a trench arranged between the first gate and the second gate, the trench extends from a surface of the first gate and a surface of the second gate to the substrate; a liner disposed along a sidewall of the trench and an endwall of the trench in contact with the substrate; a high purity cobalt disposed on the liner within the trench, the high purity cobalt including less than 200 ppm impurities; and a metal disposed on the high purity cobalt to form a contact that is substantially free of voids.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 2-5 illustrate exemplary methods of making semiconductor devices according to a first embodiment, in which:

FIGS. 6-8 illustrate exemplary methods of making semiconductor devices according to a second embodiment following FIG. 3, in which:

DETAILED DESCRIPTION

Figure 1:
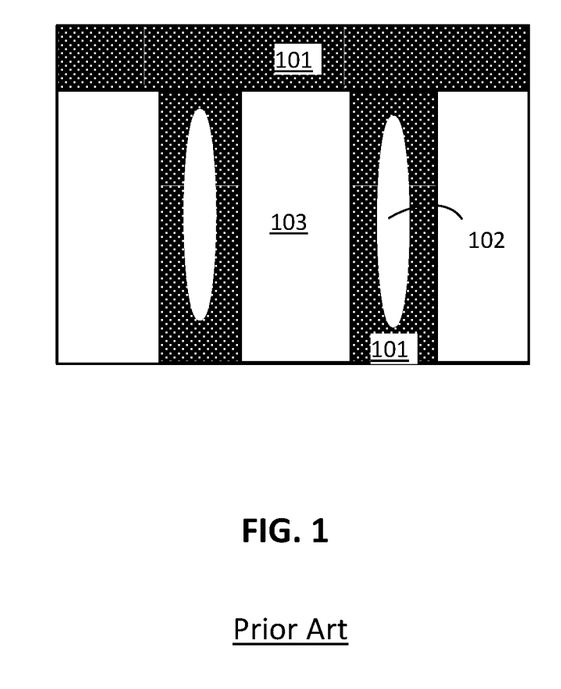
FIG. 1 is a conceptual diagram of voids formed in source/drain contacts.

As CMOS devices scale to smaller dimensions, the dimensions of contact widths become smaller. In some devices, titanium nitride (TiN) and tungsten (W) are used to fill contact trenches. However, as shown in FIG. 1, when chemical vapor deposition (CVD) is used to deposit, for example, tungsten 101, voids 102 or seams may form within trenches between gates 103 that have narrow dimensions. The voids 102 may cause high contact resistance.

Accordingly, various embodiments provide methods of making semiconductor devices using a metal reflow method. The reflow method is a physical vapor deposition (PVD) process that forms a contact metal without voids or seams. The resulting structures avoid high contact resistance that may result from such contact voids. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 2:
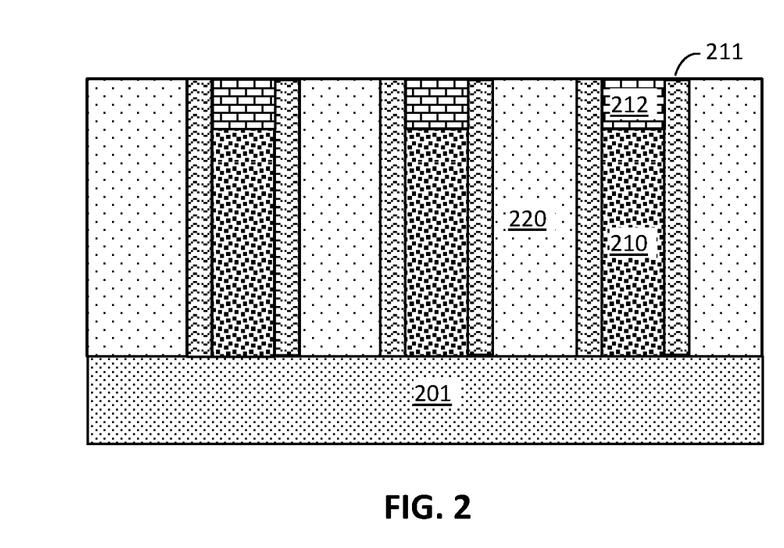
FIG. 2 is a cross-sectional side view of an interlayer dielectric (ILD) deposited between gates arranged on a substrate.

Turning again to the Figures, FIGS. 2-7 illustrate exemplary methods of making semiconductor devices according to a first embodiment. FIG. 2 is a cross-sectional side view of an interlayer dielectric (ILD) 220 deposited between gates 210 arranged on a substrate 201.

The substrate 201 may include one or more semiconductor materials. Non-limiting examples of suitable substrate 201 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. Other examples of suitable substrates 201 include silicon-on-insulator (SOI) substrates and silicon-germanium on insulator substrates with buried dielectric layers.

A source/drain (active region) (not shown) may be formed on the substrate 201 between the gates 210. The source/drain may be formed by an epitaxial growth process or by incorporating a dopant into the substrate 201. The epitaxial layers may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The epitaxial growth may include, for example, silicon, silicon germanium, and/or carbon doped silicon (Si:C) silicon, and can be doped during deposition by adding a dopant or impurity to form a silicide.

The gates 210 are gate stacks that may be formed either by a replacement metal gate process, i.e., replacing a dummy gate (including a sacrificial gate material), or by gate-first process, i.e., directly forming the gates 210 on the substrate 201.

When a replacement metal gate process is used, the dummy gates are filled with a suitable sacrificial material, for example, amorphous silicon (aSi) or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

The sacrificial gate material is replaced with a metal gate stack. The gate stack may include metal gates formed, for example, by filling the dummy gate opening with one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of materials used. The dielectric material layer may have a thickness in a range from about 0.5 to about 20 nm.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

The gates 210 include a gate cap 212 arranged thereon. An insulating hard mask material, for example, silicon nitride (SiN), SiOCN, or SiBCN is deposited on the gates 210 to form the gate cap 212. The insulating hard mask material may be deposited using a deposition process, including, but not limited to, PVD, CVD, PECVD, or any combination thereof.

Gate spacers 211 are arranged along sidewalls of the gates. The gate spacers 211 include an insulating material, for example, silicon dioxide, silicon nitride, SiOCN, or SiBCN. Other non-limiting examples of materials for the gate spacers 211 include dielectric oxides (e.g., silicon oxide), dielectric nitrides (e.g., silicon nitride), dielectric oxynitrides, or any combination thereof. The gate spacer 211 material may be deposited by a deposition process, for example, chemical vapor deposition (CVD) or physical vapor deposition (PVD).

The ILD 220 is deposited on, around and between the gates 210. The ILD 220 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 220 may be deposited by a deposition process, including, but not limited to CVD, PVD, plasma enhanced CVD, atomic layer deposition (ALD), evaporation, chemical solution deposition, or like processes.

Figure 3:
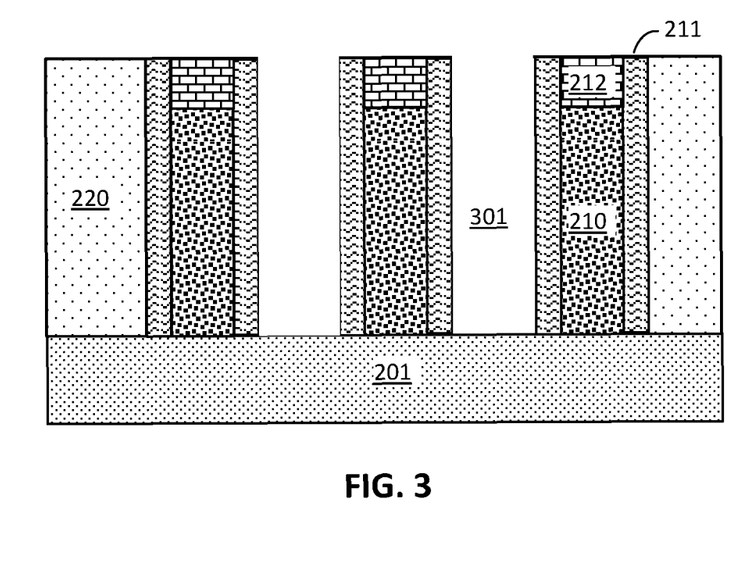
FIG. 3 is a cross-sectional side view after removing the ILD between the gates to form trenches.

FIG. 3 is a cross-sectional side view after removing the ILD 220 between the gates to form trenches 301. The trenches 301 are formed over the source/drain regions and form source/drain contact trenches between the gates 210.

To remove the ILD 220 and form the trenches 301, a resist, such as a photoresist, may be deposited and patterned. An etch process, such as a reactive ion etch (RIE), may be performed using the patterned resist as an etch mask to remove the ILD 220 until the source/drain or substrate 201 is exposed. Then the resist may be removed by, for example, ashing.

The trenches 301 may be high aspect ratio trenches, for example, having an aspect ratio (height/width) of at least 4. In some embodiments, the trenches 301 have a width in a range from about 10 to about 30 nm, and a height in a range from about 30 to about 80 nm. In other embodiments, the trenches 301 have a width in a range from about 10 to about 20 nm, and a height in a range from about 50 to about 70 nm.

Figure 4:
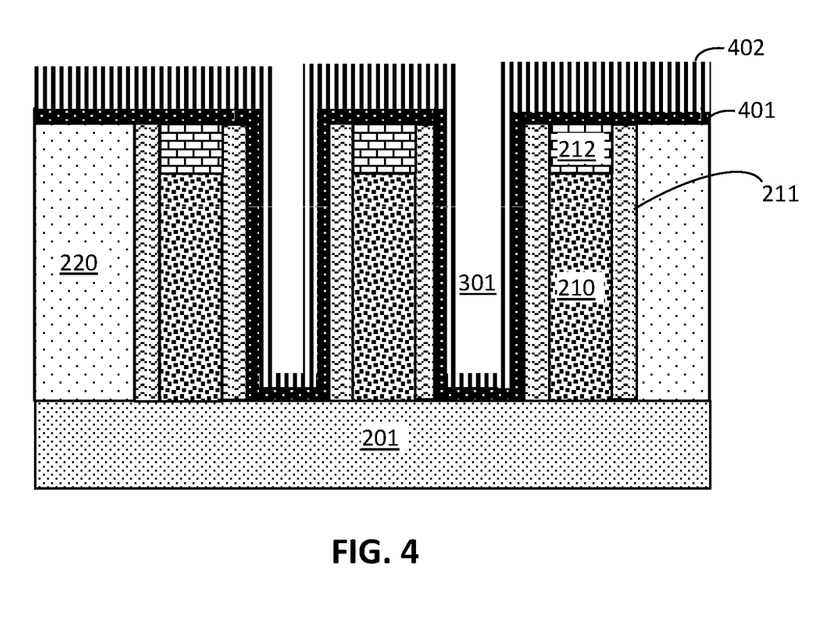
FIG. 4 is a cross-sectional side view after depositing a liner in the trench and a metal layer on the gates.

FIG. 4 is a cross-sectional side view after depositing a liner 401 and a metal layer 402 in the trench 301. The liner 401 material depends on the type of transistor and may include one or more materials that provide low contact resistance. The liner 401 may include one or more layers or films that may be formed in separate reaction chambers or in an integrated reaction chamber. Non-limiting examples of materials for the liner 401 include Co, Ti, CoTi, Ni, Pt, NiPt, NiPtTi, Ta, TaNi, TaAl, TaAlN, TiN, TiAl, TiAlN, or any combination thereof. The one or more layers/films making up the liner 401 may be formed by a chemical vapor deposition process (CVD), atomic layer deposition (ALD), or other suitable process.

The thickness of the liner 401 may generally vary and is not intended to be limited. In one embodiment, the thickness of the liner 401 is in a range from about 0.5 to about 5 nm. In another embodiment, the thickness of the liner 401 is in a range from about 1 to about 2 nm.

The metal layer 402 is deposited on the liner 401 within the trench 301, but the majority of the metal is deposited on the surface of the ILD 220 and on the gates caps 212. The metal layer 402 may be, but is not limited to, cobalt, tungsten, copper, aluminum, or a combination thereof.

The PVD process, instead of a CVD or ALD process, is used to deposit the metal layer 402. In contrast to CVD and ALD methods that result in a high content of impurities (e.g., carbon, chlorine, oxygen, and sulfur) in the final deposited film, the PVD method results in a film having a much lower content of impurities, such as carbon, chlorine, oxygen, and sulfur. For example, a cobalt layer deposited using a CVD process may include more than 1000 ppm carbon, about 80 ppm chlorine and oxygen, and about 50 ppm sulfur. In contrast, when the metal layer 402 is cobalt by the PVD method, the cobalt film has less than 200 ppm total impurities. In some embodiments, the metal layer 402 includes about 10 to about 100 ppm carbon, about 10 to about 20 ppm sulfur, about 10 to about 20 ppm oxygen, and/or about 10 to about 20 ppm chlorine.

The PVD method used to form the metal layer 402 uses a physical process to deposit the material from a target film in a single deposition step. Although some metal is deposited in the trench 301, a majority of the metal is deposited on the surface of the gate caps 212 and the ILD 220. As discussed below in FIG. 5, a heat treatment (anneal) is performed to heat the metal layer 402, to reflow the deposited metal into the trench 301. The PVD method may be, for example, electron beam PVD, pulsed laser deposition, sputter deposition, cathodic arc deposition, or other like processes.

Generally, PVD methods used to deposit metal can only form a thin film along sidewall surfaces and may not completely fill a trench contact. If more metal is deposited into the trench, the deposited metal may form a seam or void within the trench (see FIG. 1). Such PVD methods that result in seams in contact trenches may use more than a 400 W bias to maximize deposition conformity, i.e., feature/sidewall coverage.

However, the PVD method disclosed herein may use a bias as low as 150 W in some embodiments. In other embodiments, the PVD method uses a bias in a range from about 150 to about 800 W, or about 200 to about 400 W.

The amount to metal deposited may generally vary and depends on the dimensions of the trench 301. Enough metal should be deposited on the surface of the ILD 220 and gates 210 to fill the trenches 301 after heating to reflow the metal. In some embodiments, the thickness of the metal layer 402 on the surface of gates 210 is in a range from about 2 to about 100 nm.

Figure 5:
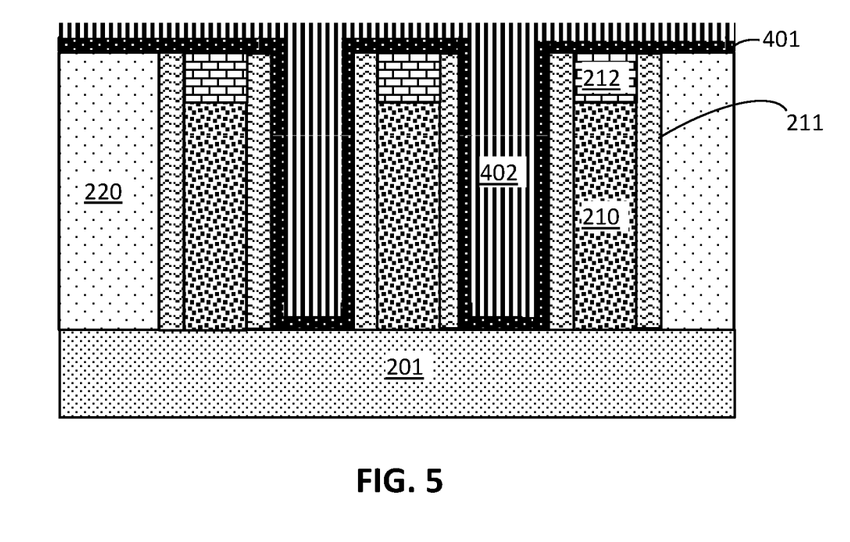
FIG. 5 is a cross-sectional side view after heating to reflow the metal into the trench.

FIG. 5 is a cross-sectional side view after heating to reflow the deposited metal layer 402 into the trench 301. The metal substantially fills the trench 301 and forms a high aspect ratio metal containing contact without seams/voids. The aspect ratio is determined by dividing the height by the width. The contacts described herein have aspect ratios of at least 3 or in a range from about 3 to about 8.

Heating to reflow the metal may be an anneal process performed by heating the wafer inside a furnace or performing a rapid thermal treatment in an atmosphere containing pure inert gases (e.g., nitrogen or argon). The anneal process may be, for example, a Rapid Thermal Anneal (RTA) or Rapid Thermal Processing (RTP). Heating may be performed in the same chamber as the metal deposition or in a different chamber than the metal deposition.

In some embodiments, the heating/anneal process is performed at a temperature in a range from about 325 to about 375° C. In other embodiments, the heating/anneal process is performed at a temperature in a range from about 200 to about 500° C.

Figure 6:
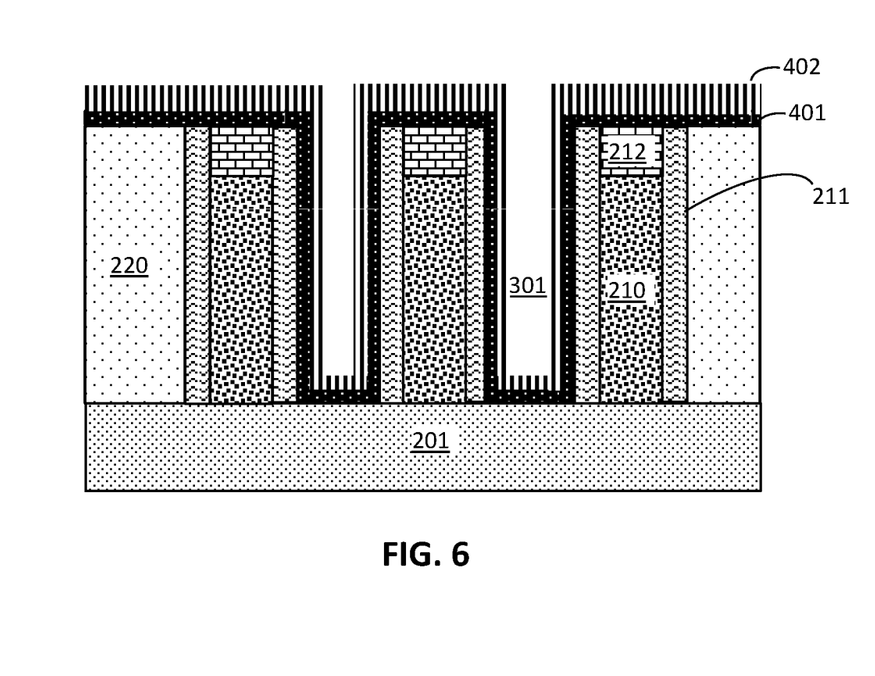
FIG. 6 is a cross-sectional side view after depositing a metal layer on the gates.
Figure 7:
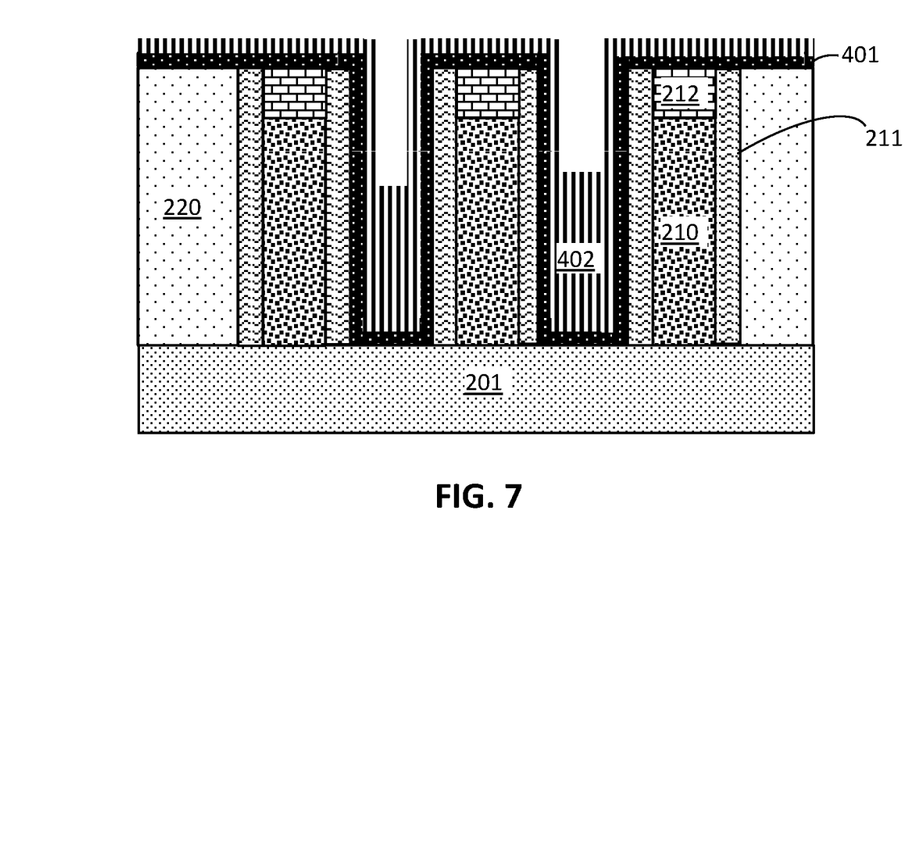
FIG. 7 is a cross-sectional side view after heating to reflow the metal and partially fill the trench.
Figure 8:
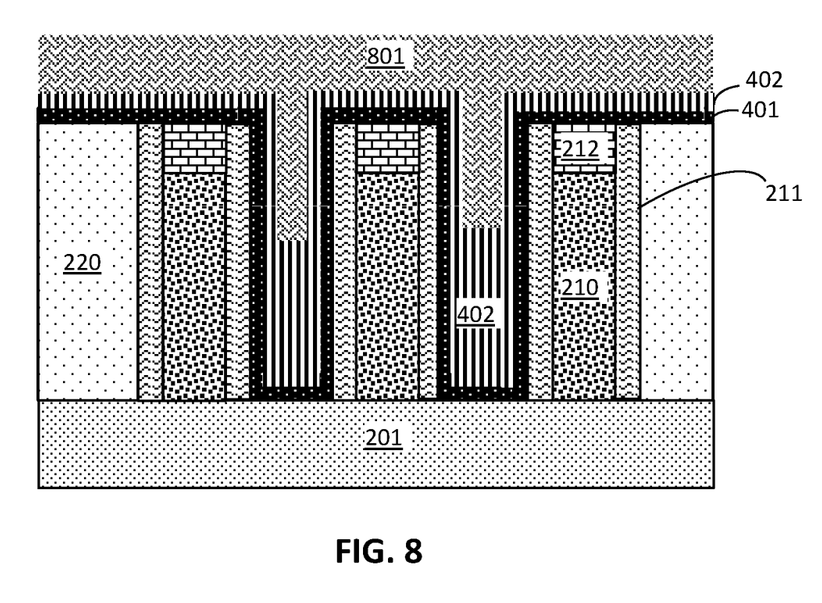
FIG. 8 is a cross-sectional side view after filling the trench with another metal.

FIGS. 6-8 illustrate exemplary methods of making semiconductor devices according to a second embodiment following FIG. 3. FIG. 6 is a cross-sectional side view after depositing a metal layer 402 in the trench 301 and on the gates 210 and the ILD 220. In contrast to the first embodiment, in which enough metal is deposited to fill the trench 301 after heating and reflow (FIG. 4), less metal is deposited. Enough metal is deposited to partially fill the trench 301 after heating and reflow.

FIG. 7 is a cross-sectional side view after heating to reflow the metal from the metal layer 402 and partially fill the trench 301. Heating and anneal is performed as described in FIG. 5.

FIG. 8 is a cross-sectional side view after filling the remaining open portions of the trench 301 with another metal 801. The metal 801 may be a conductive metal that is different than the metal of the metal layer 402. The metal 801 may be, but is not limited to, copper, tungsten, aluminum, or a combination thereof. The metal 801 may be deposited by, for example, electroplating, electroless plating, CVD, ALD, or other like processes.

As described above, various embodiments provide methods of making semiconductor devices using a metal reflow method. The reflow method is a physical vapor deposition (PVD) process that forms a contact metal without voids or seams. The resulting structures avoid high contact resistance that may result from such contact voids.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a contact in a semiconductor device, the method comprising:
   forming a first gate and a second gate on a substrate;
   removing an interlayer dielectric (ILD) material arranged between the first gate and the second gate to form a trench that extends from a surface of the first gate and a surface of the second gate to the substrate;
   depositing a liner along sidewalls of the trench and a bottom portion of the trench in contact with the substrate;
   depositing by a physical vapor deposition method (PVD) a layer of high purity cobalt that includes less than 100 parts per million of carbon on a surface of the first gate and a surface of the second gate;
   heating to reflow the layer of high purity cobalt on the surface of the first gate and the second gate into the trench and directly on the liner, the high purity cobalt completely filling the bottom portion of the trench and forming a thin film on upper sidewalls of the trench such that a thickness of the high purity cobalt on upper sidewalls of the trench is substantially thinner than a thickness that completely fills the bottom portion of the trench; and
   depositing a metal directly on the layer of high purity cobalt to fill remaining portions of the trench and form the contact;
   wherein the contact consists essentially of the liner, the layer of high purity cobalt, and the metal.

2. The method of claim 1, wherein the liner is Co, Ti, CoTi, Ni, Pt, NiPt, NiPtTi, Ta, TaNi, TaAl, TaAlN, TiN, TiAl, TiAlN, or any combination thereof.

3. The method of claim 1, wherein the PVD method is sputtering.

4. The method of claim 1, wherein the layer of high purity cobalt has a thickness in a range from about 2 to about 100 nm.

5. The method of claim 1, wherein heating is performed at a temperature in a range from about 200 to about 500° C.

6. The method of claim 1, wherein depositing by a PVD method is performed in a single step.

7. The method of claim 1, wherein depositing by a PVD method is performed at a bias in a range from about 150 to about 800 W.

8. The method of claim 1, wherein the layer of metal is cobalt, copper, tungsten, aluminum, or a combination thereof.

9. A method of forming a contact in a semiconductor device, the method comprising:
   forming a first gate and a second gate on a substrate;
   removing an interlayer dielectric (ILD) arranged between the first gate and the second gate to form a trench that extends from a surface of the first gate and a surface of the second gate to the substrate;
   depositing a liner along sidewalls of the trench and a bottom portion of the trench in contact with the substrate;
   depositing by a physical vapor deposition method (PVD) a layer of high purity cobalt on a surface of the first gate and a surface of the second gate, the high purity cobalt comprising less than 100 parts per million carbon;
   heating to reflow cobalt from the layer of high purity cobalt on the surface of the first gate and the second gate into the trench and directly on the liner, the high purity cobalt completely filling the bottom portion of the trench and forming a thin film on upper sidewalls of the trench such that a thickness of the high purity cobalt on upper sidewalls of the trench is substantially thinner than a thickness that completely fills the bottom portion of the trench; and
   depositing a metal directly on the layer of high purity cobalt to fill remaining portions of the trench to form the contact;
   wherein the contact consists essentially of the liner, the layer of high purity cobalt, and the metal.

10. The method of claim 9, wherein the layer of cobalt comprises less than 200 ppm impurities.

11. The method of claim 9, wherein the heating to reflow cobalt partially fills the trench without voids.

12. The method of claim 11, further comprising depositing a different metal on the cobalt after reflow.

13. The method of claim 12, wherein the different metal is tungsten, copper, aluminum, or a combination thereof.

14. The method of claim 9, wherein the depositing by a PVD method is performed at a bias in a range from about 200 to about 500 W.

* * * * *